(12) United States Patent
Matsuda

(10) Patent No.: US 8,471,588 B2
(45) Date of Patent: Jun. 25, 2013

(54) SEMICONDUCTOR WAFER DEVICE AND METHOD FOR TESTING THE SAME

(75) Inventor: Shigeru Matsuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 466 days.

(21) Appl. No.: 12/878,433

(22) Filed: Sep. 9, 2010

(65) Prior Publication Data

US 2011/0109343 A1    May 12, 2011

(30) Foreign Application Priority Data

Nov. 9, 2009    (JP) ................................ P2009-255651

(51) Int. Cl.
*G01R 31/26*    (2006.01)

(52) U.S. Cl.
USPC ................................. 324/762.05; 324/762.01

(58) Field of Classification Search
USPC .... 324/762.01–762.1, 750.01–750.3; 257/48; 438/14–18
See application file for complete search history.

(56) References Cited

U.S. PATENT DOCUMENTS

| 5,694,050 A * | 12/1997 | Noguchi ................. 324/754.07 |
| 6,214,630 B1 * | 4/2001 | Hsuan et al. .................... 438/11 |
| 6,774,620 B2 * | 8/2004 | Nanbu ..................... 324/754.19 |

FOREIGN PATENT DOCUMENTS

JP    2000-36523    2/2000

\* cited by examiner

*Primary Examiner* — Tung X Nguyen
(74) *Attorney, Agent, or Firm* — Oblon, Spivak, McClelland, Maier & Neustadt, L.L.P.

(57) ABSTRACT

In an embodiment, a plurality of semiconductor chip portions is provided with respect to each reticle unit in a semiconductor wafer. Each of the semiconductor chip portions is provided with a first identification code generation circuit to generate a first identification code, and a switching circuit. The switching circuit controls connection with outside. Each of second identification code generation circuits is provided on dicing line areas within each reticle unit, and generates a second identification code to select the corresponding reticle unit. Coincidence detection circuits are provided on the dicing line areas. Each of the coincidence detection circuits determines whether or not the corresponding first and second identification codes and a chip select signal coincide with each other. Bus lines are provided on the dicing line areas. One ends of the bus lines are connected to the circuits, and the other ends are connected to test pads.

20 Claims, 13 Drawing Sheets

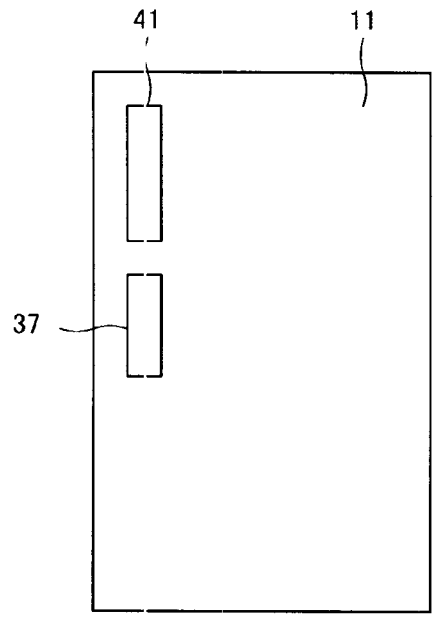
FIG. 6A
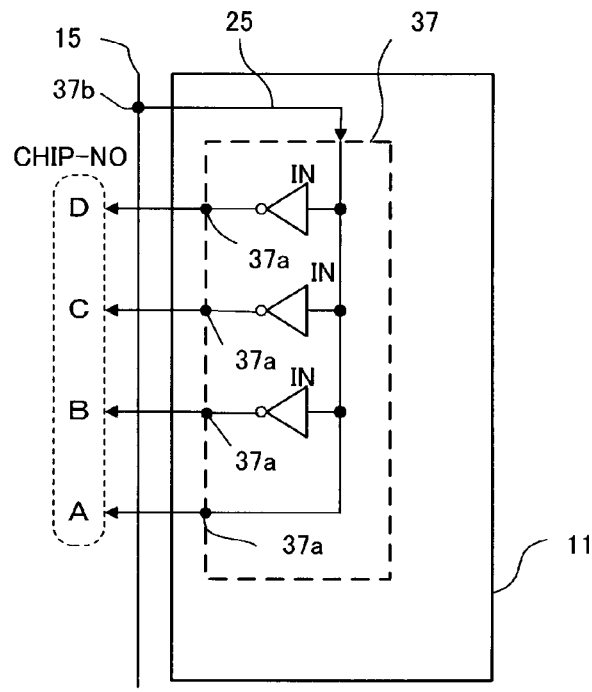
FIG. 6B
| CHIP NO. (DECIMAL NO.) | BINARY SIGNAL | | | |
|---|---|---|---|---|
| | D | C | B | A |
| 0 | L | L | L | H |
| 1 | L | L | H | L |
| 2 | L | L | H | H |
| 3 | L | H | L | L |
| 4 | L | H | L | H |
| 5 | L | H | H | L |
| 6 | L | H | H | H |
| 7 | L | H | L | L |
| 8 | H | L | L | H |
FIG. 6C

SEMICONDUCTOR WAFER DEVICE AND METHOD FOR TESTING THE SAME

CROSS-REFERENCE TO RELATED APPLICATION(S)

This application is based upon and claims the benefit of priority from the prior Japanese Patent Application No. 2009-255651, filed on Nov. 9, 2009, the entire contents of which are incorporated herein by reference.

FIELD

Embodiments described herein relate generally to a semiconductor wafer device and to a method for testing a semiconductor wafer device.

BACKGROUND

In a semiconductor wafer device, semiconductor chip portions are formed on a semiconductor wafer. The semiconductor chip portions are to be separated into individual pieces to serve as semiconductor chips including a semiconductor device respectively. On peripheral portions of each of the semiconductor chip portions, pads are provided to supply power and to input and output signals.

In an electrical characteristics test of the semiconductor chip portions, whether each of the semiconductor chip portions is defective or not is determined by checking the semiconductor chip portions individually in the state of wafer. This test is performed by bringing probes of a probe card in direct contact with the pads of the semiconductor chip portions.

A semiconductor wafer device disclosed in Japanese patent application publication No. 2000-36523 has input and output pads for testing. The pads are provided on peripheral portions of a semiconductor wafer having semiconductor chip portions. Bus lines are provided at scribe line areas. The input and output pads are connected to pads of the semiconductor chip portions via bus lines.

In order to test electrical characteristics of the semiconductor chip portions, probes of a probe card are brought into contact with the input and output pads to test the semiconductor chip portions.

In the former semiconductor wafer device, the probes of the probe card are provided so as to correspond to semiconductor chip portions of the semiconductor wafer and to the pads of the semiconductor chip portions. On the other hand, in the latter semiconductor wafer device disclosed in the patent publication, probe cards are provided so as to correspond to the input and output pads for testing.

The size and number of chips, the number and interval of pads, for example, of semiconductor chip portions embedded in a semiconductor wafer device vary depending on the functions, circuit configurations, for example, of semiconductor devices formed in the semiconductor chip portions.

When the design of a semiconductor wafer device is modified or when the design of a semiconductor device formed in a semiconductor chip portion is modified, a new probe card is needed.

BRIEF DESCRIPTION OF THE DRAWINGS

FIG. 6A is a schematic diagram showing an example of the semiconductor chip portions having a chip number generation circuit and a switching circuit.

FIG. 6B is a diagram showing a specified configuration of the chip number generation circuit.

FIG. 6C is a diagram showing a relation between a chip number and a binary signal outputted from the chip number generation circuit.

DETAILED DESCRIPTION

Figure 1:
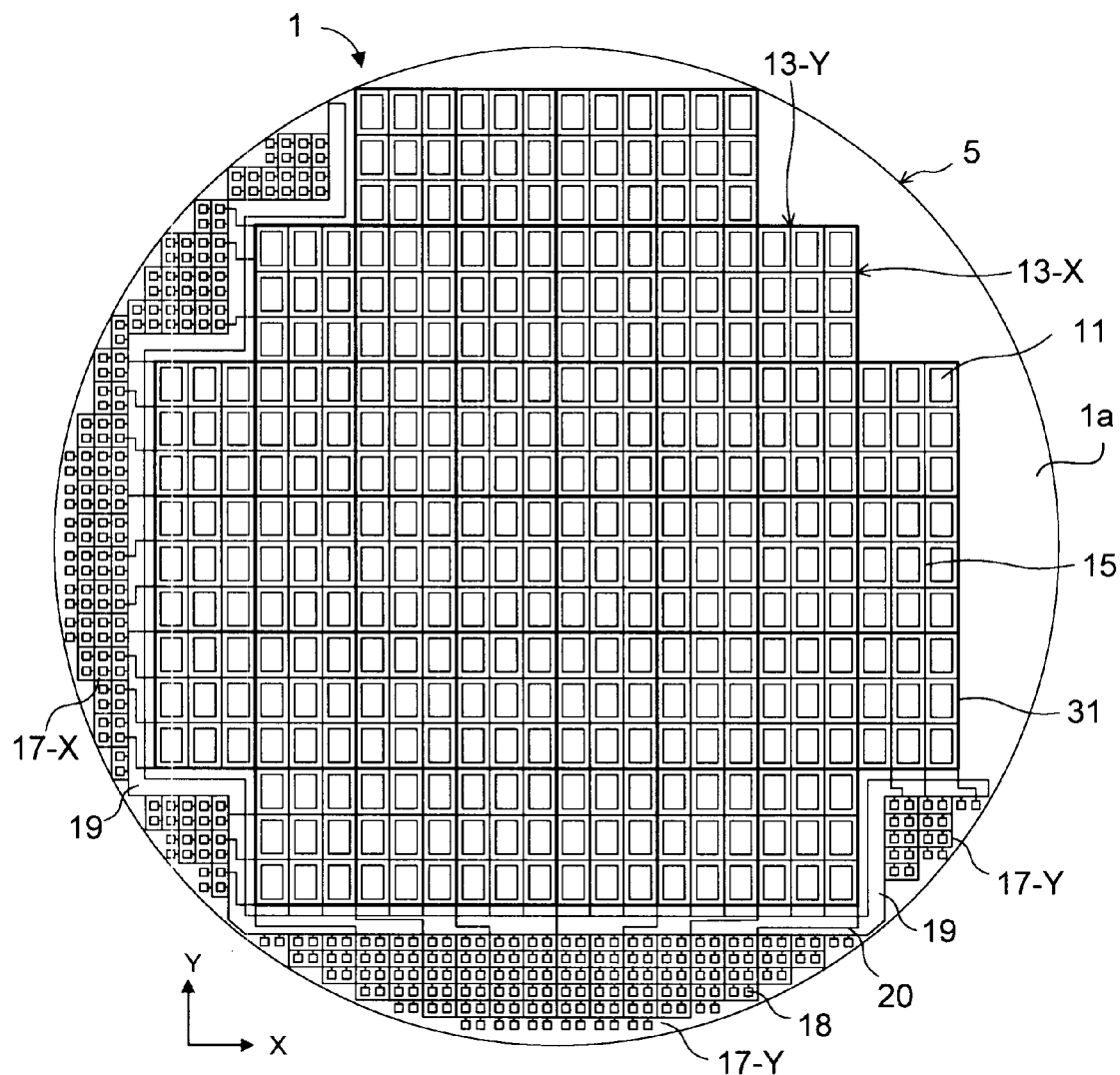
FIG. 1 is a plan view schematically showing a configuration of a semiconductor wafer device according to a first embodiment.

In one embodiment, a semiconductor wafer device is provided. The semiconductor wafer device includes a semiconductor wafer, a plurality of semiconductor chip portions, dicing line areas, first identification code generation circuits and second identification code generation circuits, coincidence detection circuits, a pad portion, and a plurality of bus lines.

The semiconductor chip portions are provided in the semiconductor wafer in an X-direction and in a Y-direction with respect to each reticle unit. Each of the semiconductor chip portions has a switching circuit configured to control connection between inside and outside of the semiconductor chip portion Each of the first identification code generation circuits is provided in each of the semiconductor chip portions to generate a first identification code to select the corresponding semiconductor chip portion. The dicing line areas are provided respectively between the semiconductor chip portions arranged in the X-direction and in the Y-direction. Each of the second identification code generation circuit is provided at a portion of the dicing line areas within each reticle unit, and is configured to generate a second identification code to select the corresponding reticle unit.

The coincidence detection circuits are respectively provided at portions of the dicing line areas within each reticle unit. Each of the coincidence detection circuits corresponds to each of the semiconductor chip portions within each reticle unit and is configured to determine whether or not the corresponding first and second identification codes and a chip select signal from the outside coincide with each other.

The pad portion is provided at a peripheral portion between the semiconductor chip portions and a peripheral edge of the semiconductor wafer. The pad portion has a plurality of test pads to input and output test signals. The bus lines are provided on the dicing line areas. One ends of the bus lines are connected to the respective first identification code generation circuit, the respective switching circuit, the second identification code generation circuit, and the coincidence detection circuits, respectively. The other ends of the bus lines are connected to the test pads, respectively.

In another embodiment, a semiconductor wafer device is provided. The semiconductor wafer device includes a semiconductor wafer, a plurality of semiconductor chip portions, dicing line areas, identification code generation circuits, coincidence detection circuits, a pad portion, and a plurality of bus lines.

The semiconductor chip portions are provided in the semiconductor wafer in an X-direction and in a Y-direction. Each of the semiconductor chip portions has a switching circuit configured to control connection between inside and outside of the semiconductor chip portion. The dicing line areas are provided respectively between the semiconductor chip portions arranged in the X-direction and in the Y-direction.

The identification code generation circuits are provided on the dicing line areas. Each of the identification code generation circuits corresponds to each of the semiconductor chip portions, and is configured to generate an identification code to select each of the semiconductor chip portions. The coincidence detection circuits are provided on the dicing line areas. Each of the coincidence detection circuits corresponds to each of the semiconductor chip portions, and is configured to determine whether or not each corresponding identification code and a chip select signal from the outside coincide with each other.

The pad portion is provided at a peripheral portion between the semiconductor chip portions and a peripheral edge of the semiconductor wafer. The pad portion has a plurality of test pads to input and output test signals. The bus lines are provided on the dicing line areas. One ends of the bus lines are connected to the respective identification code generation circuit, the respective switching circuit and the coincidence detection circuits, respectively. The other ends of the bus lines are connected to the test pads, respectively.

In further another embodiment, a method for testing a semiconductor wafer device with a test apparatus is provided. The semiconductor wafer device includes a plurality of semiconductor chip portions, a pad portion, identification code generation circuits, coincidence detection circuits, and switching circuits.

The semiconductor chip portions are provided in a semiconductor wafer. The pad portion has a plurality of test pads provided at a peripheral portion between the semiconductor chip portions and a peripheral edge of the semiconductor wafer. The identification code generation circuits are provided on the semiconductor wafer to correspond to the respective semiconductor chip portions and are configured to generate identification codes to select the semiconductor chip portions respectively. The coincidence detection circuits are provided on the semiconductor wafer to correspond to the respective semiconductor chip portions. The switching circuits are provided in the respective semiconductor chip portions to control connection between inside and outside.

In the method, a chip select signal is provided from a portion of the test pads to each of the coincidence detection circuits. Further, it is determined whether or not the chip select signal and the respective identification codes corresponding to the semiconductor chip portions coincide with each other, by the coincidence detection circuits, and one of the switching circuits is closed corresponding to one of the semiconductor chip portions for which determination is made as coincident. A test of the one of the semiconductor chip portions, for which determination is made as coincident, is executed by providing a test signal to the one of the semiconductor chip portions from the test apparatus via a portion of the test pads.

A plurality of semiconductor wafer devices, which have different numbers of semiconductor chip portions and the same number of test pads arranged in the same manner, are tested using the same test apparatus.

In further another embodiment, a method for testing a semiconductor wafer device with a test apparatus is provided. The semiconductor wafer device includes a plurality of semiconductor chip portions provided on a semiconductor wafer, a pad portion having a plurality of test pads provided at a peripheral portion between the semiconductor chip portions and a peripheral edge of the semiconductor wafer, and a plurality of bus lines. One end of each of the bus lines is connected to the corresponding semiconductor chip portion. The other end of each of the bus lines is connected to one of the test pads.

In the method, a test of the semiconductor chip portions is executed by providing a test signal from the test apparatus to each of the semiconductor chip portions via each of part of the test pads and part of the bus lines. Then, test results are outputted from each of the semiconductor chip portions to the test apparatus via part of the bus lines and part of the test pads. A plurality of semiconductor wafer devices having different numbers of semiconductor chip portions and different numbers of bus lines and having the same number of test pads arranged in the same manner are tested using the same test apparatus.

Hereinafter, further embodiments will be described in detail with reference to the drawings. In the drawings, same reference numerals represent same portions respectively.

A semiconductor wafer device according to a first embodiment will be described with reference to FIGS. 1 to 7.

FIG. 1 is a plan view schematically showing a configuration of a semiconductor wafer device according to the first embodiment.

As shown in FIG. 1, a semiconductor wafer device 1 is provided with semiconductor chip portions 11, dicing line areas 13, bus lines 15, pad portions 17-X, 17Y and a connection portion 19, respectively on a semiconductor wafer 5. The pad portions 17-X, 17-Y are provided with input and output (I/O) pads 18 for testing. The connection portion 19 is provided with connection wires 20. Hereinafter, the I/O pads 18 will be simply referred to as test pads.

The semiconductor wafer device 1 is provided with first identification code generation circuits, second identification code generation circuits, switching circuits, and coincidence detection circuits, which are not shown in FIG. 1 but will be described below with reference to FIGS. 2 to 7.

In FIG. 1, the semiconductor chip portions are formed in the semiconductor wafer 5. The semiconductor chip portions 11 are arranged in a matrix so as to be spaced from one another in an X-direction and a Y-direction. The semiconductor chip portions formed in the semiconductor wafer 5 are to be separated into individual chips to serve as semiconductor devices. The following description shows the case that each of the semiconductor chip portions 11 contains a semiconductor memory device as the semiconductor device.

The dicing line areas 13 separate the semiconductor chip portions 11 into individual pieces and are provided at peripheral portions of the semiconductor chip portions 11 in such a manner as to extend in the X-direction and the Y-direction. Hereinafter, some of the dicing line areas 13 extending in the X-direction will be referred to as X-direction dicing line areas 13-X, and the others of the dicing line areas 13 extending in the Y-direction will be referred to as Y-direction dicing line areas 13-Y.

Each of the semiconductor chip portions 11 is surrounded by the X-direction dicing line areas 13-X and the Y-direction dicing line areas 13-Y.

The pad portions 17-X, 17-Y are provided at peripheral portions 1a located between the semiconductor chip portions 11 and a peripheral edge of the semiconductor wafer 5. In the embodiment, the pad portion 17-X is provided in the X-direction, and the pad portion 17-Y is provided in the Y-direction. In more detail, the pad portion 17-X is provided at a peripheral portion located on the left side of the X-direction. On the other hand, the pad portion 17-Y is provided at a peripheral portion located on the lower side of the Y-direction.

The test pads 18 are set in advance to correspond to the maximum expected number of semiconductor chip portions so as to be applicable in common to any case where the number of semiconductor chip portions provided on a semiconductor wafer changes between semiconductor wafers due to variation in the configuration of a semiconductor device formed in each of the semiconductor chip portions.

The bus lines 15 are arranged on some of the dicing line areas 13 provided between the semiconductor chip portions 11 and on the others of the dicing line areas 13 provided at peripheral portions of the outermost semiconductor chip portions 11. The bus lines 15 are used to input and output various signals during a test.

Some of the bus lines 15 arranged on the X-direction dicing line areas 13-X are connected to the test pads of the pad portion 17-X via the connection lines 20. On the other hand, the others of the bus lines 15 arranged on the Y-direction dicing line areas 13-Y are connected to the test pads of the pad portion 17-Y via the connection lines 20.

The bus lines 15 include power supply lines VDD, GND, a clock signal line CLOCK, a serial data line DATA, a test input signal line TEST-IN, a test start signal line TEST-ST, a chip select signal line SELECT-IN, and a test result output line TEST-OUT, which will be described below.

The connection portion 19 is a region to connect the test pads 18 of the pad portions 17-X, 17-Y and the bus lines 15. In the connection portion 19, the semiconductor chip portions 11 and the test pads 18 are connected via the connection lines 20.

Such a connection portion enables flexible connection between bus lines and test pads in different semiconductor wafer devices. Further, the width or area of each connection line is set to correspond to different semiconductor wafer devices.

The semiconductor chip portions 11 of the semiconductor wafer device 1 are fabricated using a reticle (not shown), for example, by transferring circuit patterns of the reticle on the semiconductor wafer 5 while causing the semiconductor wafer to perform parallel movements repeatedly.

The reticle contains the circuit patterns so that semiconductor chip portions 11 can be formed at one time. Hereinafter, each group of the semiconductor chip portions 11 formed by one transfer of the circuit patterns of the reticle is referred to as a reticle unit 31. The reticle units 31 are portions enclosed by bold lines shown in FIG. 1, and are provided in a matrix and adjacently to each other in the X-direction and the Y-direction.

Figure 2:
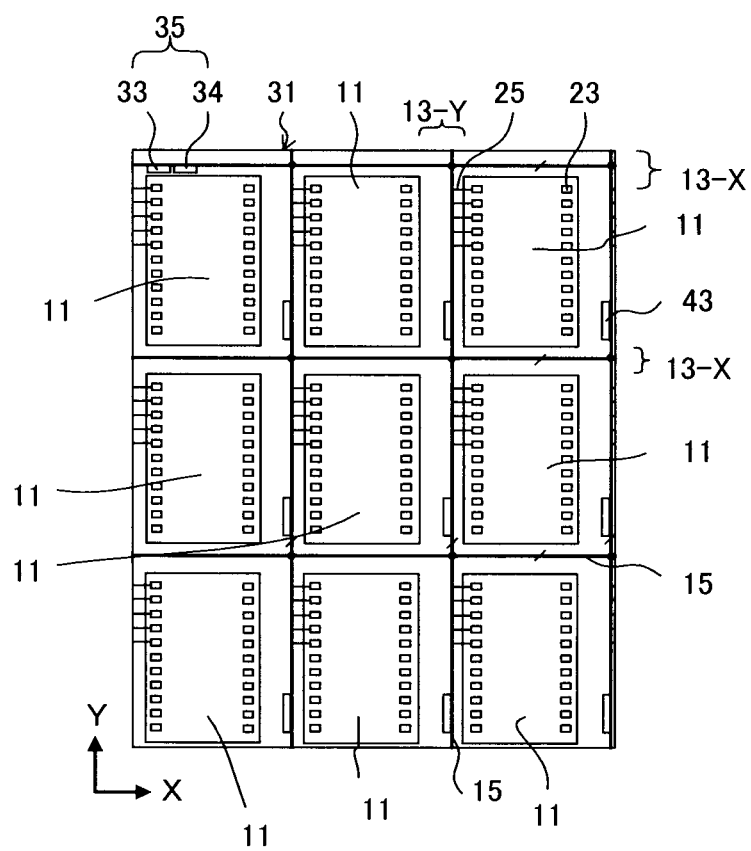
FIG. 2 is a magnified plan view schematically showing a reticle unit of the semiconductor wafer device.

FIG. 2 is a magnified plan view schematically showing the reticle unit 31. As shown in FIG. 2, each of the reticle units 31 is formed of nine (9) semiconductor chip portions 11. Each three (3) of the nine semiconductor chip portions 11 is provided in the X-direction, and each three (3) of the nine semiconductor chip portions 11 is provided in the Y-direction, for example. Each of the semiconductor chip portions 11 is provided with bonding pads 23 on the top surface. The bonding pads 23 are provided on the peripheral portion of each semiconductor chip portion 11 along the Y-direction dicing line areas 13-Y. Some of the bonding pads 23 are connected via respective signal lines 25 to some of the bus lines 15.

Each of the reticle units 31 includes the second identification code generation circuit 35 described above, respectively. The second identification code generation circuits 35 generates an identification code to select a reticle unit, and is provided on a portion of the X-direction dicing line area 13-X which is located above the semiconductor chip portion 11 positioned at an upper left end of each of the reticle units 31 on the drawing sheet.

In each of the reticle units 31, the coincidence detection circuits 43 are provided in the respective semiconductor chip portions 11. The coincidence detection circuits 43 are arranged at positions on the Y-direction dicing line areas 13-Y and at the right sides of the semiconductor chip portions 11, respectively.

The second identification code generation circuit 35 and the coincidence detection circuits 43 disappear in dicing and to separating the semiconductor chip portions 11 into chips.

Figure 3:
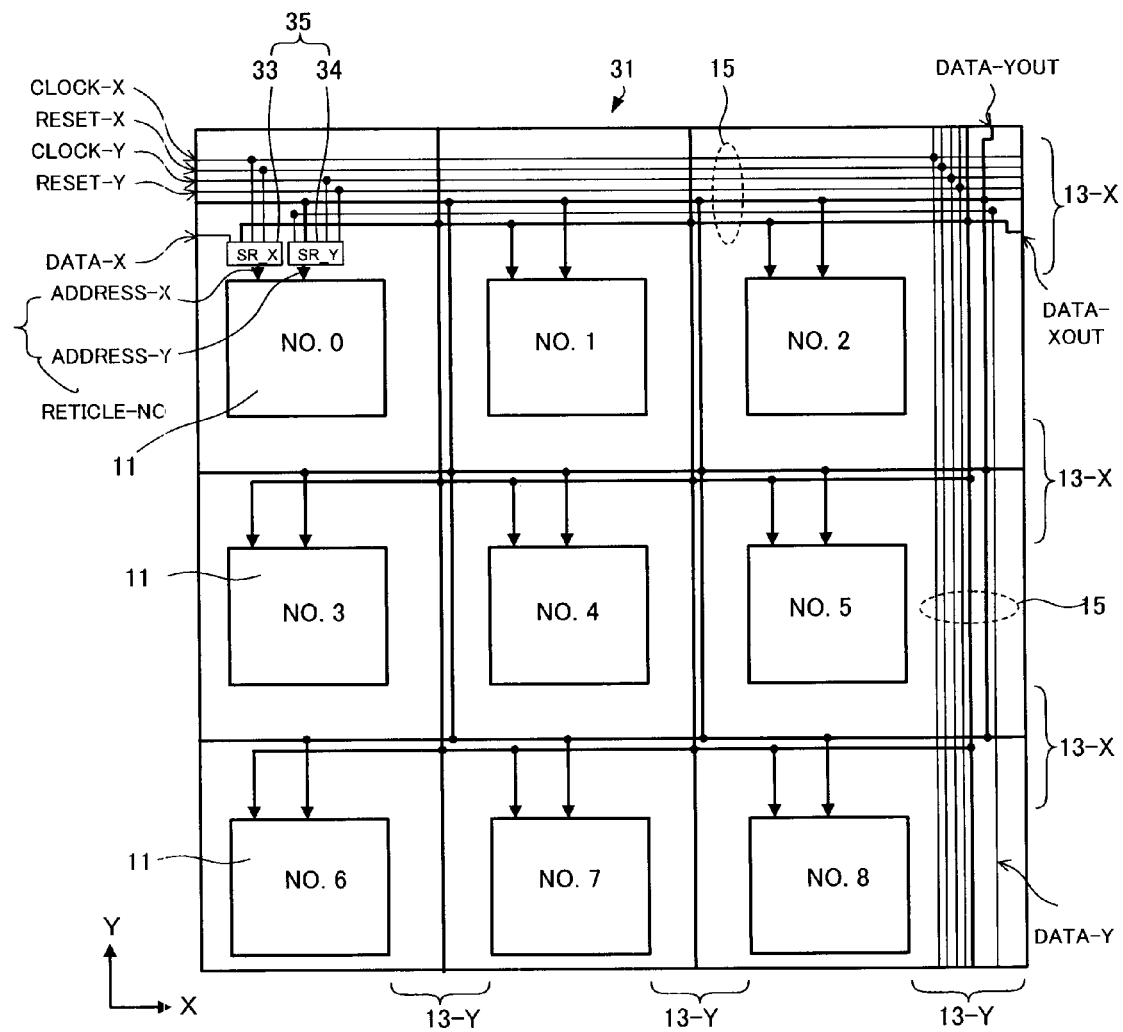
FIG. 3 is a schematic view showing an arrangement of X-coordinate and Y-coordinate shift registers in the reticle unit of the semiconductor wafer device.

FIG. 3 is a plan view showing a positional relation between the second identification code generation circuit 35 and the semiconductor chip portions 11 in the reticle unit 31.

As shown in FIG. 3, the second identification code generation circuit 35 is composed of two shift registers 33, 34. The shift register 33 represents the X-coordinate of the reticle unit 31, and hereinafter is referred to as an X-coordinate shift register. The shift register 34 represents the Y-coordinate of the reticle unit 31, and hereinafter is referred to as a Y-coordinate shift register.

Each of the reticle units 31 is given a reticle number RETICLE-NO as an identification code. The reticle number RETICLE-NO is composed of the X-coordinate ADDRESS-X and the Y-coordinate ADDRESS-Y.

The above-described X-coordinate shift register 33 and the Y-coordinate shift register 34 are provided in a portion of the X-direction dicing line 13-X located above the semiconductor chip portion 11 positioned at an upper left end of the reticle unit 31.

The X-coordinate shift register 33 is provided with a clock signal CLOCK-X, a reset signal RESET-X, and serial data DATA-X. The Y-coordinate shift register is also provided with a clock signal CLOCK-Y, a reset signal RESET-Y, and serial data DATA-Y.

Output serial data DATA-XOUT, DATA-YOUT obtained from the X-coordinate and Y-coordinate shift registers 33, 34 are respectively transmitted to other adjacent X-coordinate and Y-coordinate shift registers.

The X-coordinate shift register 33 and the Y-coordinate shift register 34 may be provided at another position within the reticle unit 31, for example, in a portion of the X-direction dicing line located above the semiconductor chip portion 11 positioned at the center, or in a portion of the X-direction dicing line located above the semiconductor chip portion 11 positioned at an upper right end.

Alternatively, the X-coordinate shift register 33 may be provided on one of the X-direction dicing line areas 13-X, and the Y-coordinate shift register 34 may be provided on one of the Y-direction dicing line areas 13-Y.

Further, the X-coordinate shift register 33 and Y-coordinate shift register 34 can be provided inside the semiconductor chip portion 11 located at an upper left end. Further, the reticle number RETICLE-NO generated by the X-coordinate shift register 33 and the Y-coordinate shift register 34 may be stored in a memory unit inside a semiconductor chip portion 11.

Figure 4A:
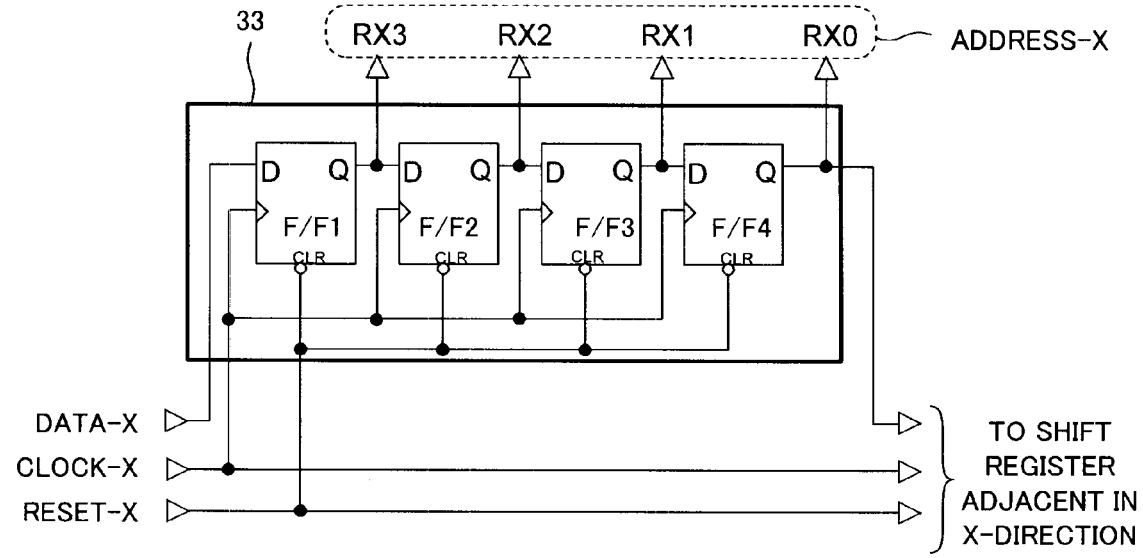
FIG. 4A is a schematic diagram showing a configuration of the X-coordinate shift register.

FIG. 4A is a schematic view showing a configuration of the X-coordinate shift register 33.

As shown in FIG. 4A, the X-coordinate shift register 33 is formed of four-stage D-type flip flops F/F1 to F/F4 connected in series each other. An output terminal Q of a first-stage D-type flip flop F/F1 is connected to an input terminal D of a second-stage D-type flip flop F/F2, an output terminal Q of the second-stage D-type flip flop F/F2 is connected to an input terminal D of a third-stage D-type flip flop F/F3, and an output terminal Q of the third-stage D-type flip flop F/F3 is connected to an input terminal D of a fourth-stage D-type flip flop F/F4.

Serial data DATA-X is inputted to the input terminal D of the first-stage D-type flip flop F/F1, and outputs RX3, RX2, RX1 and RX0 are outputted through the output terminals Q of the first to fourth-stage D-Type flip flops F/F1 to F/F4, respectively. Further, a clock signal CLOCK-X and a reset signal RESET-X are inputted to each of the first to fourth-stage D-type flip flops F/F1 to F/F4.

The outputs RX3, RX2, RX1 and RX0 represent the X-coordinate ADDRESS-X of each reticle unit 31. In more detail, the 4-bit X-coordinate represents the X-coordinate of the 8-bit reticle number RETICLE-NO as an identification code specifying the reticle unit 31.

Figure 5A:
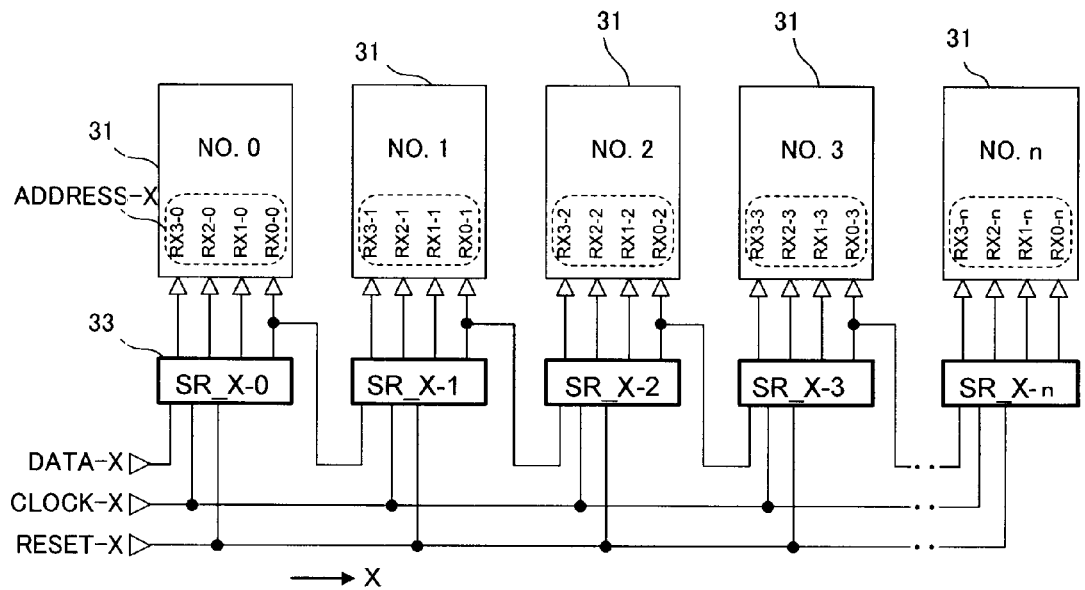
FIG. 5A is a schematic diagram showing a connection relation of X-coordinate shift registers provided in an X-direction.

FIG. 5A is a diagram showing a connection relation among X-coordinate shift registers 33 of the reticle units 31 provided in the X-direction.

As shown in FIG. 5A, in each of the reticle units 31, an output from the output terminal Q of the final-stage D-type flip flop F/F4 is inputted to an input terminal D of the X-coordinate shift register 33 adjacent in the X-direction. For example, the X-coordinate shift registers 33 of the reticle units 31 from the left end to the right end in the X-direction are connected in series.

Figure 4B:
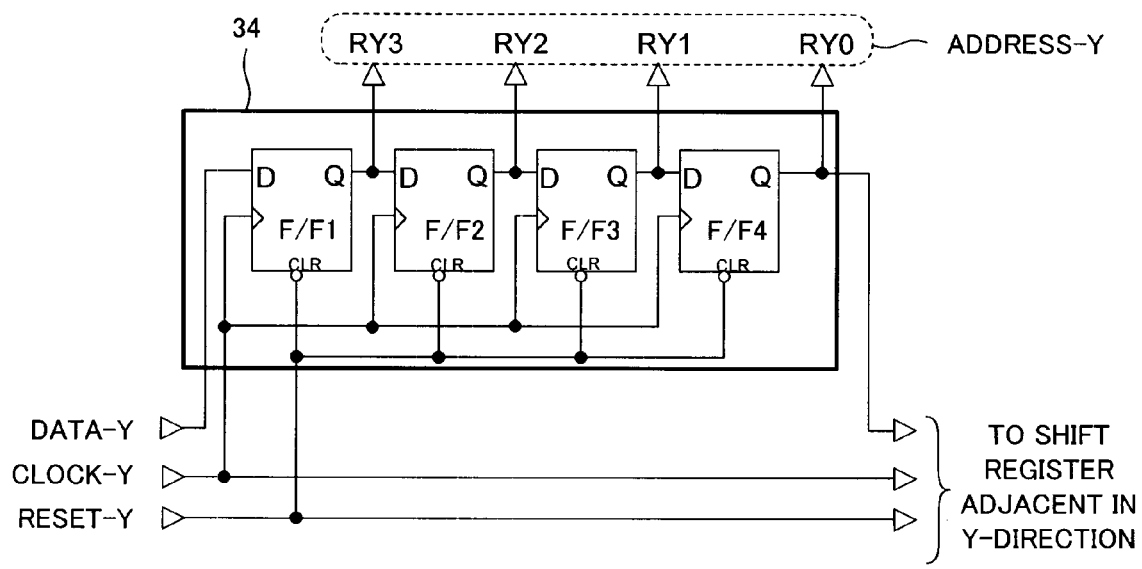
FIG. 4B is a schematic diagram showing a configuration of the Y-coordinate shift register.

FIG. 4B is a schematic diagram showing a configuration of the Y-coordinate shift register 34.

As shown in FIG. 4B, the Y-coordinate shift register 34 is formed of four-stage D-type flip flops F/F1 to F/F4. Similarly with the X-coordinate shift register 33, in the Y-coordinate shift register 34, the outputs RY3, RY2, RY1 and RY0 are outputted through the output terminals Q of the first to the fourth-stage D-type flip flops F/F1 to F/F4, respectively. The outputs RY3, RY2, RY1 and RY0 represent the Y-coordinate ADDRESS-Y of the 8-bit reticle number RETICLE-NO specifying the reticle unit 31.

In other words, each of the reticle units 31 includes a reticle number RETICLE-NO of 8-bit parallel data composed of RX3, RX2, RX1 and RX0 representing a 4-bit X-coordinate, and of RY3, RY2, RY1 and RY0 representing a 4-bit Y-coordinate.

Figure 5B:
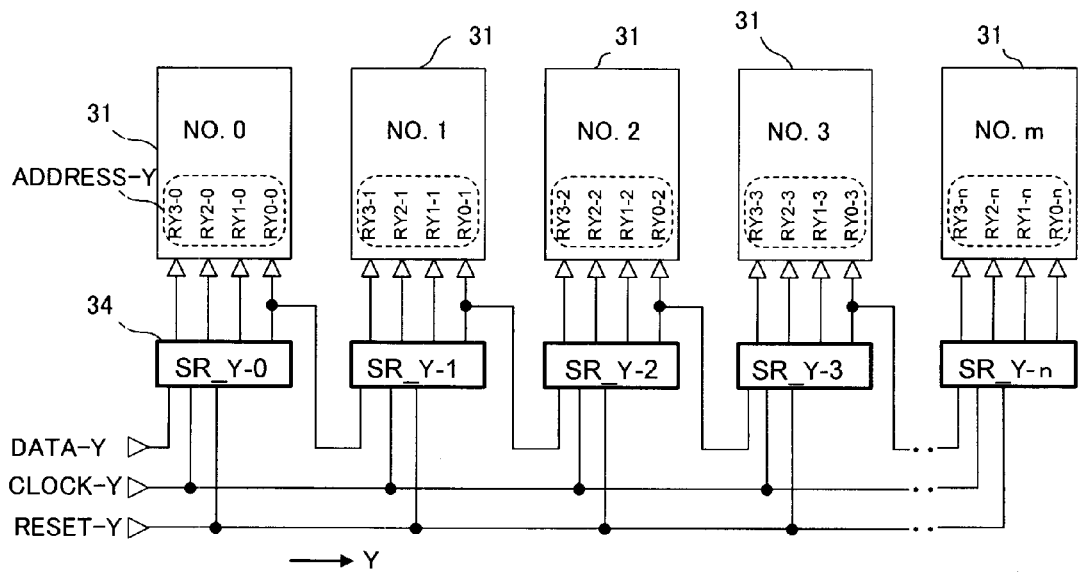
FIG. 5B is a schematic diagram showing a connection relation of Y-coordinate shift registers provided in a Y-direction.

FIG. 5B is a diagram showing a connection relation among Y-coordinate shift registers 34 of the reticle units 31 in the Y-direction. As shown in FIG. 5B, in each of the reticle units 31, an output from the output terminal Q of the final-stage D-type flip flop F/F4 is inputted to the input terminal D of the Y-coordinate shift register 34 in the reticle unit 31 adjacent in the Y-direction. For example, the Y-coordinate shift registers 34 of the reticle units 31 from the left end to the right end in the Y-direction are connected in series.

In each of the X-coordinate shift registers 33 and the Y-coordinate shift registers 34, the number of D-type flip flops F/F can be determined within an identifiable number of bits.

In each of the reticle units 34, the X-direction coordinate ADDRESS-X is set as follows. A low level (hereinafter, referred to as "L" level) reset signal RSET is provided for a predetermined period of time from one of the test pads 18 corresponding to the X-coordinate shift registers 33, to the X-coordinate shift registers 33 of all the reticle units 31, so that the outputs Q of all the X-coordinate shift registers 33 are set to "L" level.

Then, from one of the test pads 18, serial data DATA-X to set the X-coordinate is sequentially inputted to the X-coordinate shift register 33 in the reticle unit 31 located closest to the test pad 18. The inputted serial data DATA-X is sequentially sent to the X-coordinate shift register 33 of the next reticle unit 31 by a clock signal CLOCK-X. The inputted serial data DATA-X is finally written into the X-coordinate shift register 33 of the end reticle unit 31 in the X-direction. As a result, the X-coordinate ADDRESS-X is set in each of the X-coordinate shift registers 33 of all the reticle units 31 arranged in the X direction.

By repeating the above-described setting operation for each group of the reticle units 31 in the X-direction, the unique 4-bit X-coordinate ADDRESS-X are set in the respective groups of the reticle units 31 arranged in the X-direction. When each of the reticle units 31 provided in the X-direction is given a different identification code (number) as an X-coordinate ADDRESS-X, the X-coordinate shift registers 33 need not to be sequentially connected.

Similarly, a different Y-coordinate ADDRESS-Y may be set in each of the Y-coordinate shift registers 34 of all the reticle units 31 arranged in the Y-direction, by performing an operation similar to the above identification code setting operation for the X-coordinate shift registers 33 of the reticle units 31 arranged in the X-direction.

FIG. 6A is a schematic diagram showing an example of the semiconductor chip portions having the chip number generation circuit and the switching circuit. FIG. 6B is a diagram showing a configuration of the chip number generation circuit. FIG. 6C is a diagram showing relations between chip numbers generated by the chip number generation circuit and binary signals.

As shown in FIG. 6A, the chip number generation circuit 37 as a first identification code generation circuit and the switching circuit 41 are provided in the semiconductor chip portion 11. The chip number generation circuit 37 is a circuit to generate a chip number to identify an individual semiconductor chip portion in a reticle unit 31. As shown in FIG. 6B, the chip number generation circuit 37 is formed by selectively embedding inverter circuits IN in the semiconductor chip portion 11.

The chip number generation circuit 37 generates a chip number CHIP-NO formed of a 4-bit binary signal by receiving a high level (hereinafter, referred to as a "H" level) of a test start signal TEST-ST from one of the bus lines 15 via a signal line 25.

The following case is that, as shown in FIG. 3, chip numbers 0 to 8 are allocated to the nine semiconductor chip portions 11 of the reticle unit 31, in the order from the semiconductor chip portion at an upper left end to the semiconductor chip portion at a lower right end. It is assumed that the binary signals shown in FIG. 6C correspond to the chip numbers 0 to 8 shown in FIG. 3.

Any inverter circuit IN is not connected between an input end 37b to input a test start signal TEST-ST and the lowest one of the output ends 37a to output one of the binary signals, so that a "H" level of the test start signal TEST-ST may be outputted to the lowest one of the output terminals 37a.

On the other hand, the inverter circuits IN are connected between the input end 37b and the other output ends 37a to output a "L" level as a binary signal, so that the "H" level of the test start signal TEST-ST may be outputted inversely to the other output terminals 37a.

For example, in the semiconductor chip portion 11 having the chip number of 0, "L(0)," "L(0)," "L(0)" and "H(1)" are allocated respectively as binary signals D to A as shown in FIG. 6C. Thus, as shown in FIG. 6B, the inverter circuits IN are provided between the input end 37b and the output ends 37a corresponding to the binary signals B to D, but not between the input e 37b and the output end 37a corresponding to the binary signal A.

The "H" level of binary signal may be generated by connecting an even number of inverters IN with each other in series, for example. The "L" level of binary signal may be generated by connecting an odd number of inverters IN with each other in series.

In each of the reticle units 31, binary signals can be associated with chip numbers 0 to 8, as shown in FIG. 6C. For example, in one of the reticle units 31 having the reticle number composed of an X-coordinate ADDRESS-X of "0101" and a Y-coordinate ADDRESS-Y of "0011," the semiconductor chip portion 11 having the chip number of 0 can be associated with the 12-bit identification code "010100110001." The semiconductor chip portions 11 provided in the semiconductor wafer 5 are given respectively different identification codes. The bit number of the identification code may be changed according to the number of the reticle units 31 arranged in the X-direction or the Y-direction and the number of the semiconductor chip portions provided in each reticle unit 31.

The switching circuit 41 of FIG. 6A provides or shuts off test signals TEST to be sent via part of the bus lines 15 to the corresponding semiconductor chip portion 11.

Figure 7:
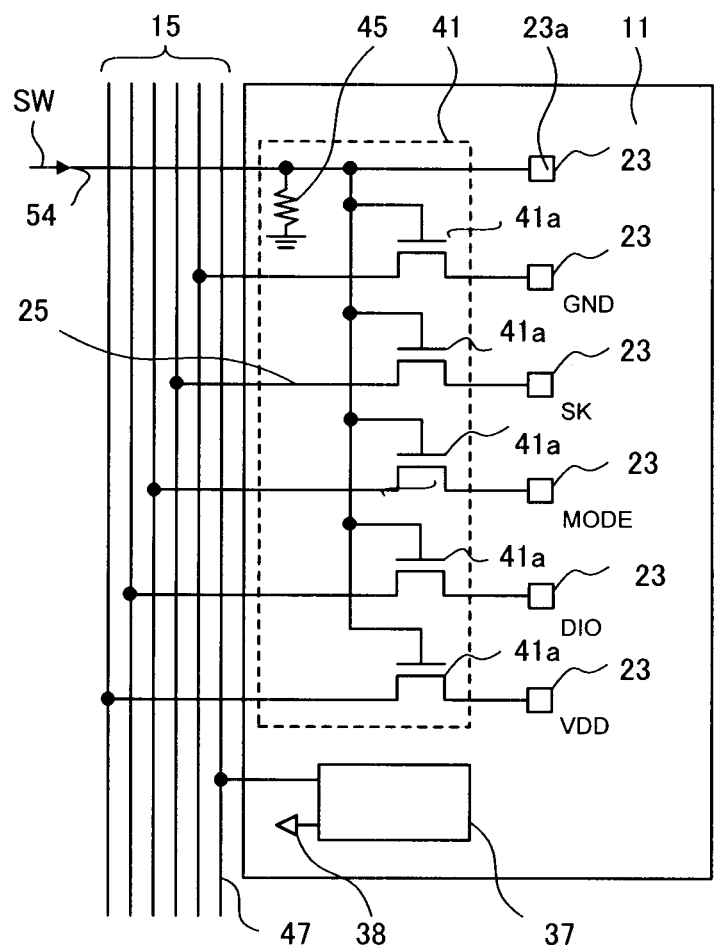
FIG. 7 is a schematic diagram showing a specified configuration of the switching circuit.

FIG. 7 is a schematic diagram showing a configuration of the switching circuit.

The switching circuit 41 is formed of switching elements, for example, n-channels MOSFETs 41a. Hereinafter, the n-channel MOSFETs 41a are simply referred to as n-MOSFETs.

One of the drain and source of each of the n-MOSFETs 41a is connected to each of part of the bus lines 15 via each signal line 25, and, the other of the drain and source of each of the n-MOSFETs 41a is connected to each bonding pad 23. The n-MOSFETs 41a are provided to correspond to the number of test signals TEST. A switching signal SW, which will be described below, is provided in common to the gates of the n-MOSFETs 41a through a signal line 54 to switch on or off the n-MOSFETs 41a simultaneously.

The gate of each of the n-MOSFETs 41a is grounded via a resistor element 45 and also connected to a bonding pad 23a. The resistor element 45 is formed to have a resistance as high as about 100 kΩ, for example. When the semiconductor chip portions 11 are separated to individual semiconductor chips 11 after testing, the gate of each of the n-MOSFETs 41a is turned to a ground potential by the resistor element 45, and is kept in a shut-off state without activation of the n-MOSFETs 41a.

As the test signals TEST, a power supply potential VDD, a ground potential GND, a clock signal CLOCK, a test mode signal MODE, and data input/output signal DIO, for example, are inputted from part of the bus lines 15 to part of the semiconductor chip portions 11 via the signal lines 25.

Figure 8:
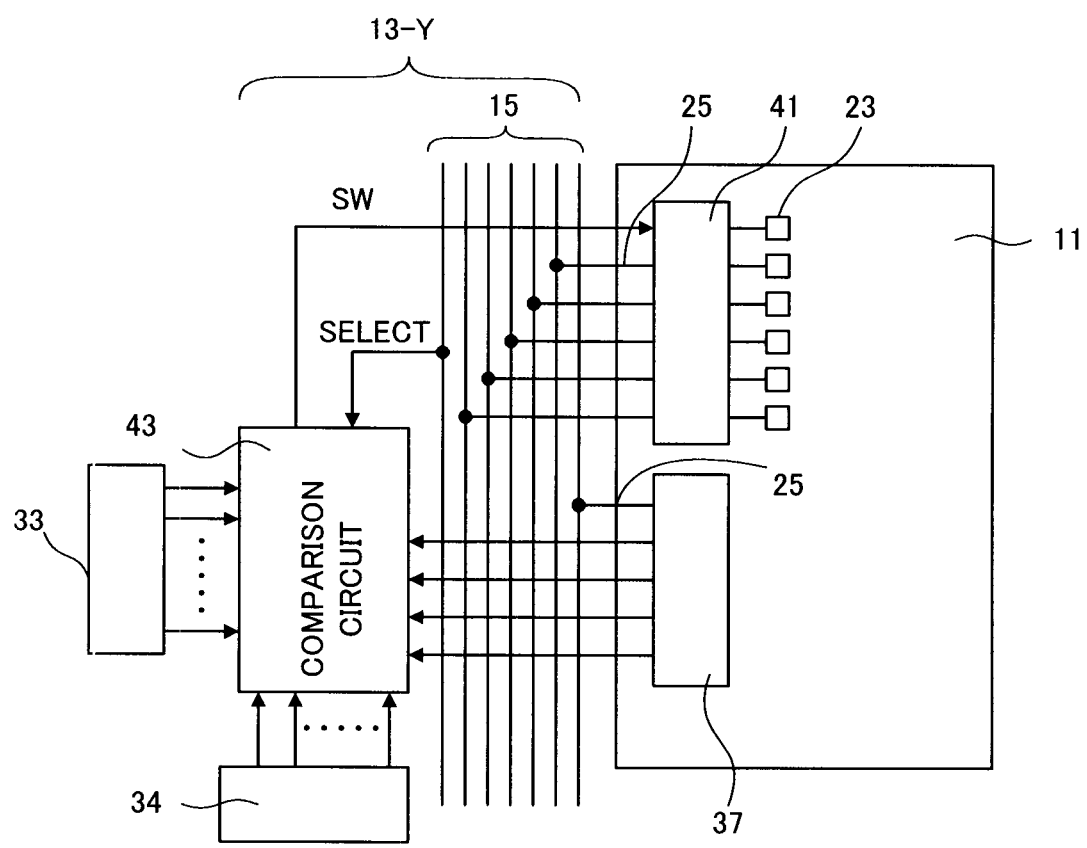
FIG. 8 is a diagram to explain operation to select a semiconductor chip portion.

A test is performed by selecting the semiconductor chip portions 11 of each of the reticle units 31 on the basis of identification codes. The semiconductor chip portions 11 are selected as follows. As shown in FIG. 8, the coincidence detection circuits 43 illustrated in FIG. 2 are provided on the Y-direction dicing line areas 13-Y to correspond to the respective semiconductor chip portions 11.

The identification code described above is inputted to the coincidence detection circuit 43. As mentioned above, the identification code is a code to identify a semiconductor chip portion 11 and represented by a combination of a reticle number RETICLE-NO from the X-coordinate shift register 33 and the Y-coordinate shift register 34 and of the chip number CHIP-NO generated by the chip number generation circuit 37. A chip select signal SELECT is inputted into the coincidence detection circuit 43 from one of the test pads 18 via one of the bus lines 15.

The coincidence detection circuit 43 verifies the chip select signal SELECT and the identification code of the semiconductor chip portion 11 on a bit basis to determine whether they coincide with each other or not. As will be described below, the chip select signal SELECT includes a signal to select one of the semiconductor chip portions and one of the reticle units. If it is determined that the chip select signal SELECT and the chip identification code coincide with each other at all bits, the coincidence detection circuit 43 outputs a switching signal SW of "H" level to the switch circuit 41. The coincidence detection circuit 43 is composed of an exclusive OR inverter (hereinafter, referred to as an "EX-NOR gate"), for example. In a case that the chip select signal SELECT is parallel data, it can be inputted directly to the EX-NOR gate. In a case that the chip select signal SELECT is serial data, it is inputted to the EX-NOR gate after being converted to parallel data.

After the chip select signal SELECT and the chip identification code of the semiconductor chip portion 11 are verified by the coincidence detection circuit 43, one of the semiconductor chip portions 11 are selected. Hereinafter, the selected semiconductor chip portion 11 is simply referred to as a selected chip portion 11. The switching signal SW (described with reference to FIG. 7) outputted from the coincidence detection circuit 43 is provided to the switching circuit 41 of each selected chip portion 11 to put the n-MOSFETs 41a of the switching circuit 41 in a conduction state.

Test signals TEST from part of the test pads 18 (described with reference to FIG. 1) are inputted to the selected chip portion 11 via part of the bus lines 15 and the n-MOSFETs 41a. A test in each selected chip portion 11 is executed on the basis of the Built-in Self Test Circuit (hereinafter, referred to as a "BIST circuit"), for example. A test result from the selected chip portion 11 is outputted via the corresponding bus line 15, and is read into a test apparatus through a probe card (not shown) via the corresponding test pad 18.

In the semiconductor wafer device according to the above-described embodiment, the test pads 18 are set in advance to be as many as the maximum expected number of semiconductor chip portions, so as to be applicable in common to any case where the number of the semiconductor chip portions 11 provided on the semiconductor wafer 5 is changed between semiconductor wafers due to variation in the configuration of a semiconductor device formed in each of the semiconductor chip portions 11.

In more detail, if the size of each semiconductor chip portion 11 is changed between semiconductor wafers of the same diameter, due to the variation in the configuration of a semiconductor device formed in the semiconductor chip portion 11, one of the semiconductor wafers is provided with a larger or smaller number of semiconductor chip portions than the other semiconductor wafer. If the size of the semiconductor chip portions are larger, and one of the semiconductor wafers is provided with a smaller number of semiconductor chip portions, the number of test pads becomes surplus and some pads remain unused.

On the other hand, if the size of the semiconductor chip portions of the other of the semiconductor wafers with the same diameter is smaller, and the other of the semiconductor wafers is provided with a larger number of semiconductor chip portions, the number of test pads becomes short.

Since the number of semiconductor chip portions to be provided on a semiconductor wafer in different semiconductor devices can be estimated in advance, the number of the test pads 18 is preferably set to correspond to the maximum expected number of semiconductor chip portions. Unused test pads 18 can be skipped to be used during a test by software of the above-described test apparatus.

Thus, even if a semiconductor device formed in a semiconductor chip portion of a semiconductor wafer device varies, a common probe card can be used.

Further, in the semiconductor wafer device according to the above-described embodiment, some of the bus lines 15 formed on the X-direction dicing line areas 13-X are connected respectively to the test pads of the pad portion 17-X located in the X-direction, while the others of the bus lines 18 formed on the Y-direction dicing line areas 13-Y are connected respectively to the test pads of the pad portion 17-Y located in the Y-direction, so that the length of the bus lines 15 is shortened.

In the semiconductor wafer device according to the embodiment, in each reticle unit 31, different chip numbers are given to the respective semiconductor chip portions 11 within each reticle unit 31. On the other hand, the same chip number can be used among the semiconductor chip portions disposed respectively in different reticle units 31. Thus, the number of bits in the identification code representing the chip number can be reduced as compared with the case where different chip numbers are given to the respective semiconductor chip portions 11 provided in the semiconductor wafer 5.

A semiconductor wafer device according to a modification of the first embodiment of the invention will be described with reference to FIG. 9. In the semiconductor wafer device according to the modification, a switching circuit includes a booster circuit.

Figure 9:
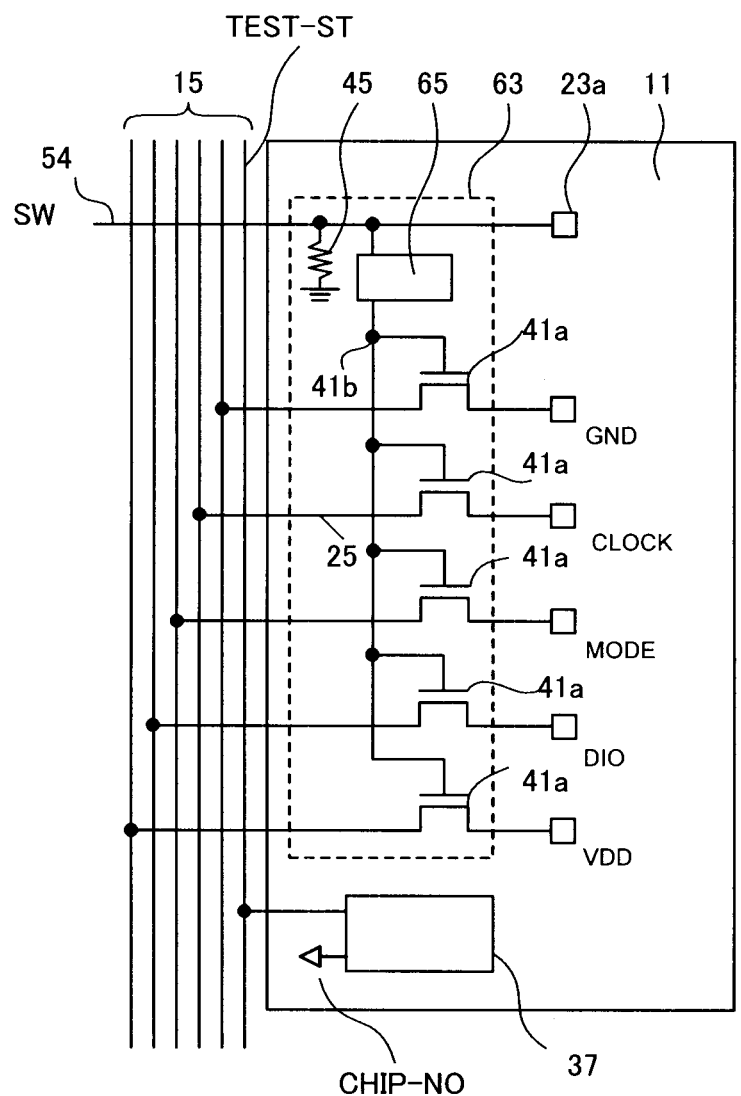
FIG. 9 is a schematic diagram showing a configuration of a switching circuit in a modification of the semiconductor wafer device according to the first embodiment.

As shown in FIG. 9, in the semiconductor wafer device according to the modification, a booster circuit 65 is connected between a signal line 54 to provide a switching signal SW and connection nodes 41b connected with the gates of n-MOSFETs 41a, in a switching circuit 63 of a semiconductor chip portion 11. The switching signal SW sent from the coincidence detection circuit 43 is boosted and applied to the gates of the n-MOSFETs 41a. The booster circuit 65 may be a known booster circuit.

In the semiconductor wafer device according to the modification, the switching signal SW boosted in the booster circuit 65 is applied to the gate of each of the n-MOSFETs 41a in the switching circuit 63. This enhances switching capacity in addition to the advantages described with respect to the semiconductor wafer device according to the first embodiment.

A semiconductor wafer device according to another modification of the first embodiment will be described with reference to FIG. 10. The semiconductor wafer device according to the modification does not include the second identification code generation circuit 35 employed in the first embodiment. Further, in the semiconductor wafer device according to the modification, chip number generation circuits 75 serving as first identification code generation circuits are formed, instead of the configuration composed the inverters IN employed in the first embodiment shown in FIG. 6B. The chip number generation circuits 75 generate an identification signal of each of the semiconductor chip portions within each reticle unit 72. The chip number generation circuits 75 is composed of an X-coordinate shift register 73 indicating the X-direction coordinate and a Y-coordinate shift register 74 indicating the Y-direction coordinate.

Figure 10:
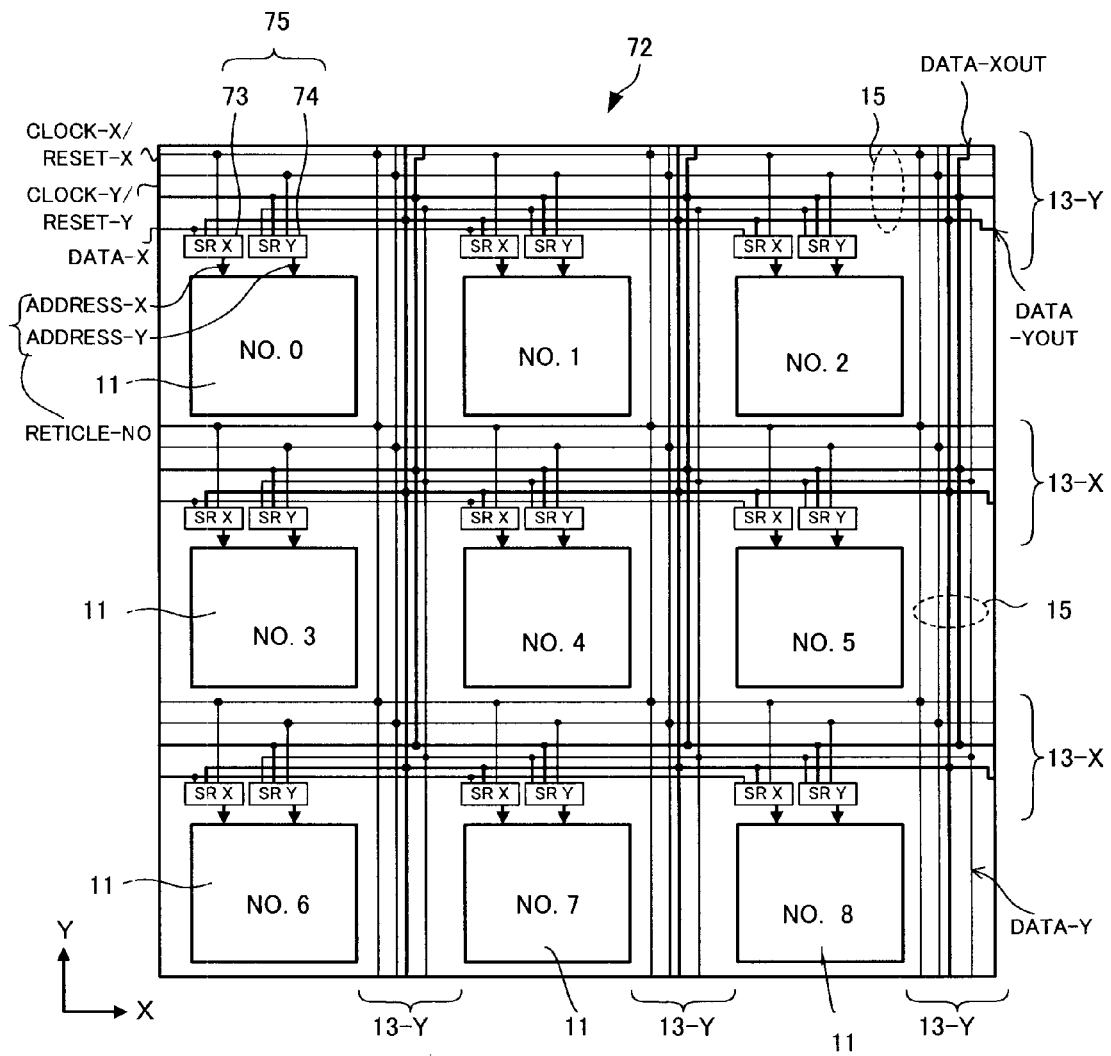
FIG. 10 is a schematic diagram showing a configuration of a reticle unit in another modification of the semiconductor wafer device according to the first embodiment.

As shown in FIG. 10, in the semiconductor wafer device according to the modification, the X-coordinate shift register 73 and the Y-direction shift register are provided in each of the semiconductor chip portions 11 within each reticle units 72. The X-coordinate shift register 73 and the Y-coordinate shift register 74 are provided on the X-direction dicing line areas 13-X located above the respective semiconductor chip portions 11.

Each of the X-coordinate shift registers 73 and the Y-coordinate shift registers 74 is composed of six-stage D-type flip flops F/F. This configuration allows the X-coordinate shift register 73 and the Y-coordinate shift register 74 to generate 12-bit identification codes i.e. chip numbers different from each other, for the respective semiconductor chip portions 11.

In the semiconductor wafer device according to the modification, the identification code is generated with respect to each semiconductor chip portion 71. In the semiconductor wafer device according to the first embodiment, if only a portion of a reticle unit 31 is formed at the peripheral portion of the semiconductor wafer 5 and if the X-coordinate shift register 33 and the Y-coordinate shift register 34 generating the reticle number are not formed in the formed reticle unit 31, any identification number can not be given for the semiconductor chip portions 11 within the reticle unit 31. On the other hand, in the semiconductor wafer device according to the modification shown in FIG. 10, the identification code is generated with respect to each semiconductor chip portion 11. Thus, the identification code can be generated for all the semiconductor chip portions 71 so long as the semiconductor chip portions 11 are provided on the semiconductor wafer 5.

As a result, the semiconductor chip portions 11 can be provided to the peripheral portion of the semiconductor wafer device 5. This increases the actual number of the semiconductor chip portions 11 to be provided on the semiconductor wafer 5.

A semiconductor wafer device according to still another modification of the first embodiment will be described with reference to FIG. 11. In the semiconductor wafer device according to the modification, one of the semiconductor chip portions are selected by a signal for starting reading out test results, and the test results of the selected semiconductor chip portion are read out.

Figure 11:
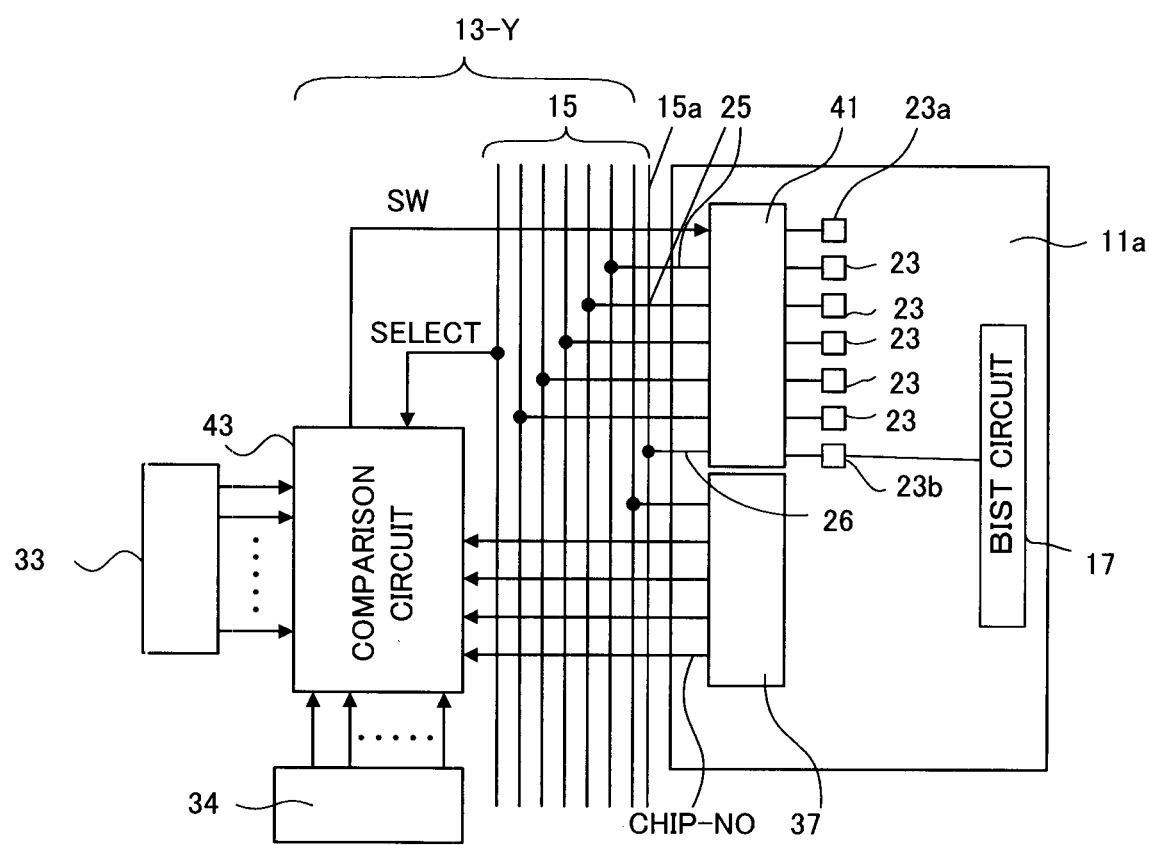
FIG. 11 is a schematic diagram showing a circuit to select a semiconductor chip portion in further another modification of the semiconductor wafer device according to the first embodiment.

As shown in FIG. 11, in the semiconductor wafer device according to the modification, a bonding pad 23b serves as a pad to read out a test result of a semiconductor chip portion 11. For example, the boding pad 23b is connected to an output terminal of a BIST circuit provided in the semiconductor chip portion 11 and is capable of storing test results. Thus, a test output signal from the bonding pad 23b is outputted to a signal line 26 via the switching circuit 41 and further outputted to a test result output line 15a within the bus lines 15.

When reading out test results, a test result reading start signal provided to one of the bus lines 15 from one of the test pads 18 is provided to a chip numbering circuits 37 arranged in each semiconductor chip portion 11a. Upon receiving the test result reading start signal, the chip numbering circuit 37 outputs a chip number to the coincidence detection circuit 43.

The coincidence detection circuit 43 verifies the identification code of the semiconductor chip portion 11, which is composed of the chip number and a reticle number given by the X-coordinate shift register 33 and the Y-coordinate shift register 34, and binary data of the chip select signal SELECT. If the chip and reticle numbers and the chip select signal coincide with each other, the switching signal SW is provided to the switching circuit 41 of the selected semiconductor chip portion 11. The switching signal SW turns the switching circuit 41 to a closed state, the bonding pad 23b and the bus lines 15a are connected to each other via the switching circuit 41, and test results stored in the BIST circuit 17 are read out from the bonding pad 23b to the bus lines 15a.

When starting a test, identification of one semiconductor chip portion 11 is not needed. Therefore, for example, test can be executed in each semiconductor chip portion 11 at the same time by selecting each semiconductor chip portion 11 simultaneously with the chip select signal SELECT and by sending a test input signal to each the semiconductor chip portion 11 simultaneously.

In the semiconductor wafer device according to the modification, the test is executed simultaneously by providing a test input signal TEST to semiconductor chip portions 11 simultaneously. This allows shortening the test duration.

Hereinafter, a semiconductor wafer device according to a second embodiment will be described with reference to FIG. 12 and FIG. 1. In the semiconductor wafer device according to this embodiment, semiconductor chip portions are selected directly from test pads.

Figure 12:
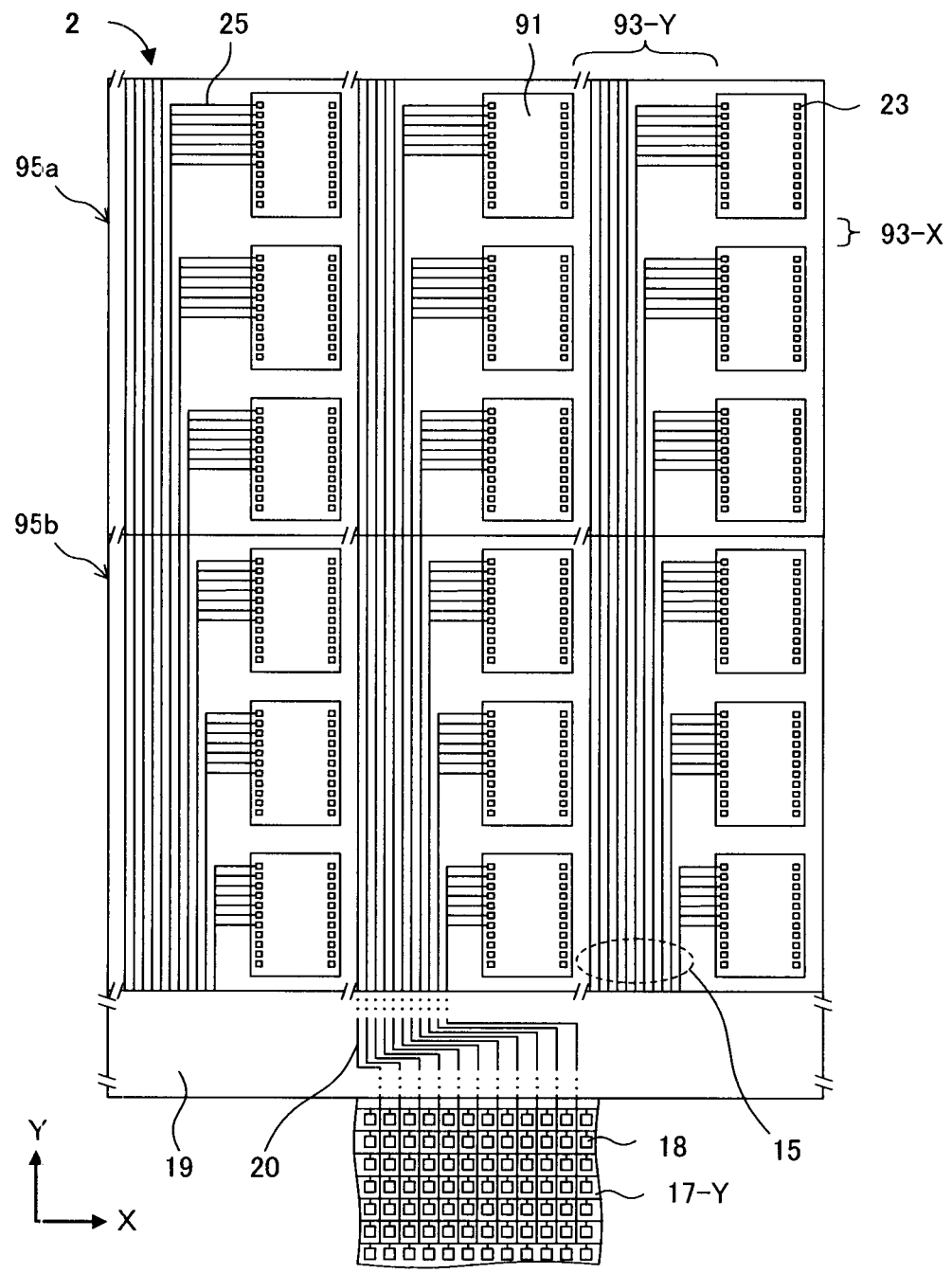
FIG. 12 is a plan view schematically showing a configuration of a semiconductor wafer device according to a second embodiment.

As shown in FIG. 12 and FIG. 1, in a semiconductor wafer device 2, bus lines 15 to be used for testing semiconductor chip portions 91 are provided independently on Y-direction dicing line areas 93-Y. The bus lines 15 for testing the semiconductor chip portions 91 are connected respectively to test pads 18 of a pad portion 17-Y provided in a lower portion of the semiconductor wafer 5 via connection lines 20 arranged in the connection line portion 19.

Except for the semiconductor chip portions 91, Y-direction dicing line areas 93-Y, the pad portion 17-Y, and connection line portion 19 are shown in a magnified manner for suitable illustration.

In a portion of Y-direction dicing line areas 93-Y located closest to the test pads 18, all of part of the bus lines 15 connecting with part of the semiconductor chip portions 19 arranged in the Y-direction are disposed parallel to each other. In other words, the Y-direction dicing line areas 93-Y are set to a width sufficient to accommodate the number of the above part of the bus lines 15 corresponding to the maximum number of the part of the semiconductor chip portions 91 arranged in the Y-direction. The width of the X-direction dicing line areas 93-X can be smaller than that of the Y-direction dicing line areas 93-Y.

The number of bus lines in the Y-direction increases as they are closer to the pad portion 17-Y. For this reason, in a manufacturing process using reticles, reticles having different number of bus lines extending in the Y-direction are prepared.

Bus lines 15 whose number is proportional to the number of the semiconductor chip portions 91 are connected to the test pads 18. Assuming that the number of the semiconductor chip portions 91 of this embodiment is the same as the semiconductor wafer device 1 of the first embodiment, the number of the test pads 18 arranged in the semiconductor wafer device 2 of this embodiment increases. The width of the connection line portion 19 needs to be increased, since the number of the connection lines 20 increases as the number of the test pads 18 increases. Similarly to the first embodiment, the number of the test pads 18 and the width of the connection line portion 19 are set to predetermined values according to an estimation so that the pads can be used in common in different semiconductor wafer devices In the semiconductor wafer device according to the second embodiment, The part of the bus lines 15 are connected from the semiconductor chip portions 91 directly to the test pads 18, which eliminates generation of the identification code to select each of the semiconductor chip portions 91 for testing. The test pads 18 are provided on each semiconductor wafer device in advance so that the test pads 18 can be used in common in different semiconductor wafer devices, and are connected to the part of the bus lines 15 in the connection line portion 19.

Consequently, in the semiconductor wafer device according to the second embodiment, bus lines and test pads to be connected are independent with respect to each semiconductor chip portion 91. This allows testing all the semiconductor chip portions 91 simultaneously and obtaining test results simultaneously.

A semiconductor wafer device according to a modification of the second embodiment will be described with reference to FIG. 13. In the semiconductor wafer device according to the modification, the bus lines are provided so as to extend over each of the semiconductor chip portions.

Figure 13:
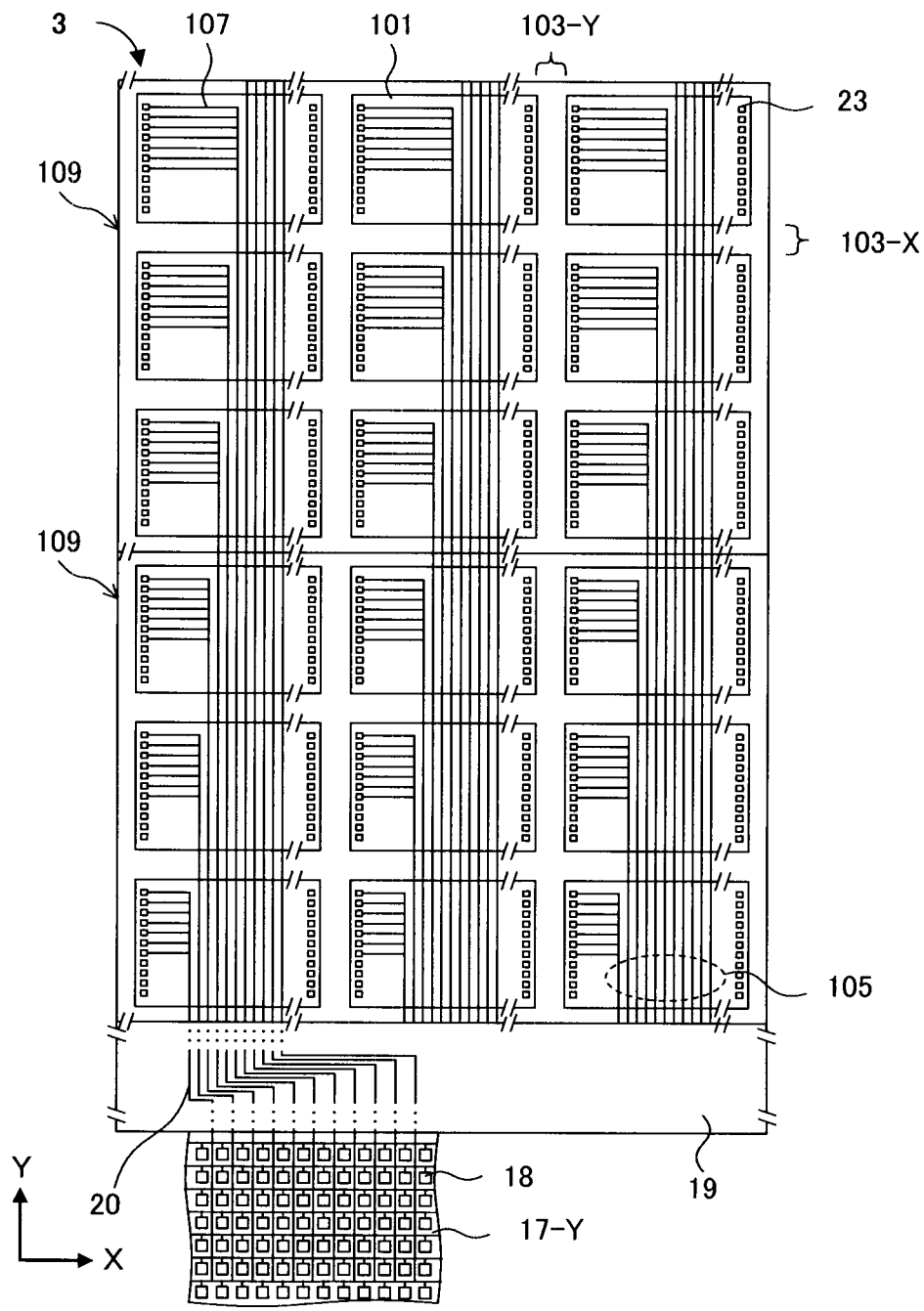
FIG. 13 is a plan view schematically showing a configuration of a semiconductor wafer device according to a modification of the second embodiment.

As shown in FIG. 13, in a semiconductor wafer device 3 according to the modification, bus lines 105 for testing are provided so as to extend over semiconductor chip portions 101 and in the X-direction. The bus lines 105 are formed on a surface protection film (not shown) covering the upper surface of each of the semiconductor chip portions 101. In more detail, the bus lines 105 are formed as follows.

The surface protection film is formed to expose bonding pads 23 of the semiconductor chip portions 101. Then, a conductive film, for example, a conductive resin film, is formed over the surface protection film. Further, the conductive resin film is patterned to form the bus lines 15 so that one ends of the bus lines may be connected to the bonding pads 23 and that the other ends of the bus lines may be connected to test pads 18. After test of the semiconductor chip portions 101, the patterned conductive resin film is calcinated to an extent that it can be removed. Patterning of the conductive resin film can be performed by an ink jet print method, a photolithography method, for example.

The bus lines 105 are provided toward the test pads 18 located in a lower portion of the semiconductor wafer 5 along the Y-direction dicing line areas 103-Y. The bus lines 105 are connected respectively to the test pads 18 by the connection lines 20 arranged in the connection line portion 19.

Portions of the bus lines 105 may be formed on the dicing line areas 103-Y. In FIG. 13, X-direction widths of the semiconductor chip portions 101, the pact portion 17-Y and the connection line portion 19 are shown in a magnified manner for suitable illustration.

In the semiconductor wafer device according to the modification, the bus lines 105 are provided so as to extend over the top surfaces of the semiconductor chip portions 101 and in the X-direction. Thus, the dicing line areas 103-Y can be set to a width necessary for dicing. This may reduce the width of a dicing line area as compared with that of the second embodiment in which part of the bus lines 15 are provided on the dicing line areas 93-Y. According to the modification, the bus lines do not need to be patterned on the reticles to be used in a manufacturing process.

As described above, in the semiconductor wafer device according to the modification, the semiconductor chip portions 101 are directly connected to the test pads 18 by the bus lines 105 for testing. Further, the bus lines 105 are provided so as to extend over the upper surface of each of the semiconductor chip portions 101.

Consequently, the width of each dicing line 103 can be set to a width necessary for dicing. This allows increasing the number of the semiconductor chip portions 101 per a semiconductor wafer 5 as compared with that of the second embodiment.

While certain embodiments have been described, these embodiments have been presented by way of example only, and are not intended to limit the scope of the inventions. Indeed, the novel devises and methods described herein may be embodied in a variety of other forms; furthermore, various omissions, substitutions and changes in the form of the devises and methods described herein may be made without departing from the spirit of the inventions. The accompanying claims and their equivalents are intended to cover such forms or modifications as would fall within the scope and spirit of the inventions.

What is claimed is:

1. A semiconductor wafer device, comprising:
   a semiconductor wafer;
   a plurality of semiconductor chip portions provided in the semiconductor wafer in an X-direction and in a Y-direction with respect to each reticle unit, each of the semiconductor chip portions having a first identification code generation circuit and a switching circuit configured to control connection between inside and outside of the semiconductor chip portion the first identification code generation circuit configured to generate a first identification code to select the corresponding semiconductor chip portion
   dicing line areas provided respectively between the semiconductor chip portions arranged in the X-direction and in the Y-direction;
   second identification code generation circuits each of which is provided at a portion of the dicing line areas within each reticle unit and is configured to generate a second identification code to select the corresponding reticle unit;
   coincidence detection circuits provided at portions of the dicing line areas within each reticle unit, each of the coincidence detection circuits corresponding to each of the semiconductor chip portions within each reticle unit and being configured to determine whether or not the corresponding first and second identification codes and a chip select signal from the outside coincide with each other;
   a pad portion provided at a peripheral portion between the semiconductor chip portions and a peripheral edge of the semiconductor wafer, the pad portion having a plurality of test pads to input and output test signals; and
   a plurality of bus lines provided on the dicing line areas, one ends of the bus lines being connected to the first identification code generation circuit, the switching circuit, the second identification code generation circuit, and the coincidence detection circuit, respectively, the other ends of the bus lines being connected to at least part of the test pads, respectively.

2. The semiconductor wafer device according to claim 1, wherein each of the first identification code generation circuits is formed by embedding at least one inverter selectively.

3. The semiconductor wafer device according to claim 1, wherein each of the second identification code generation circuits is composed of an X-coordinate shift register to generate an X-coordinate and a Y-coordinate shift register to generate a Y-coordinate.

4. The semiconductor wafer device according to claim 3, wherein each of the X-coordinate shift register and the Y-coordinate shift register is composed of a plurality of flip flops connected in series.

5. The semiconductor wafer device according to claim 3, wherein the X-coordinate shift register is provided on one of the dicing line areas extending in the X-direction, and the Y-coordinate shift register is provided on one of the dicing line areas extending in the X-direction or in the Y-direction.

6. The semiconductor wafer device according to claim 3, wherein each X-coordinate shift register of each reticle unit arranged along the same X-coordinate axis is connected in series, and each Y-coordinate shift register of each reticle unit arranged along the same Y-coordinate axis is connected in series.

7. The semiconductor wafer device according to claim 6, wherein each of the X-coordinate shift register and the Y-coordinate shift register is composed of a plurality of flip flops connected in series.

8. The semiconductor wafer device according to claim 1, wherein the switching circuit is composed of a plurality of switching elements, each of the switching elements is provided between corresponding ones of the bus lines and corresponding bonding pads of the semiconductor chip portions, and switching operations of the switching elements are controlled by a switching signal.

9. The semiconductor wafer device according to claim 8, wherein each of the switching elements is a MOSFET and the switching signal is provided to a gate of the MOSFET.

10. The semiconductor wafer device according to claim 9, wherein the gate of the MOSFET is further grounded via a high resistivity element.

11. The semiconductor wafer device according to claim 10, further comprising a booster circuit configured to boost the switching signal, wherein the switching signal boosted by the booster circuit is provided to the gate of the MOSFET.

12. The semiconductor wafer device according to claim 1, wherein
   the pad portion is provided at each of peripheral portions of the semiconductor wafer in the X-direction and in the Y-direction,
   the bus lines are provided on the dicing line areas extending in the X-direction and Y-direction, and
   the bus lines provided on the dicing line areas extending in the X-direction are connected to test pads of the pad portion provided in the X-direction, and
   the bus lines provided on the dicing line areas extending in the Y-direction are connected to test pads of the pad portion provided in the Y-direction.

13. The semiconductor wafer device according to claim 1, wherein ones of the second identification code generation circuits is provided on one of the dicing line areas extending in the X-direction, and ones of the coincidence detection circuits are provided on one of the dicing line areas extending in the Y-direction.

14. The semiconductor wafer device according to claim 1, wherein the number of the test pads are set in advance so as to correspond to the maximum expected number of the semiconductor chip portions, so as to be applicable in common to any case where the number of semiconductor chip portions provided on the semiconductor wafer changes due to variation in a configuration of a semiconductor device formed in each of the semiconductor chip portions.

15. The semiconductor wafer device according to claim 1, wherein the same code is generated as each of the first identification codes among different reticle units, and a different code is generated as each of the second identification codes among the different reticle units.

16. A semiconductor wafer device, comprising:
a semiconductor wafer;
a plurality of semiconductor chip portions provided in the semiconductor wafer in an X-direction and in a Y-direction, each of the semiconductor chip portions having a switching circuit configured to control connection between inside and outside of the semiconductor chip portion;
dicing line areas provided respectively between the semiconductor chip portions arranged in the X-direction and in the Y-direction;
identification code generation circuits provided on the dicing line areas, each of the identification code generation circuits corresponding to each of the semiconductor chip portions and being configured to generate an identification code to select each of the semiconductor chip portions;
coincidence detection circuits provided on the dicing line areas, each of the coincidence detection circuits corresponding to each of the semiconductor chip portions and being configured to determine whether or not each corresponding identification code and a chip select signal from the outside coincide with each other;
a pad portion provided at a peripheral portion between the semiconductor chip portions and a peripheral edge of the semiconductor wafer, the pad portion having a plurality of test pads to input and output test signals and
a plurality of bus lines provided on the dicing line areas, one ends of the bus lines being connected to the identification code generation circuit, the switching circuit and the coincidence detection circuit, respectively, the other ends of the bus lines being connected to at least part of the test pads, respectively.

17. The semiconductor wafer device according to claim 16, wherein each of the identification code generation circuits is composed of an X-coordinate shift register to generate an X-coordinate and a Y-coordinate shift register to generate a Y-coordinate.

18. The semiconductor wafer device according to claim 17, wherein each of the X-coordinate shift register and the Y-coordinate shift register is composed of a plurality of flip flops connected in series.

19. A method for testing a semiconductor wafer device with a test apparatus, the semiconductor wafer device including a plurality of semiconductor chip portions provided in a semiconductor wafer, a pad portion having a plurality of test pads provided at a peripheral portion between the semiconductor chip portions and a peripheral edge of the semiconductor wafer, identification code generation circuits provided on the semiconductor wafer to correspond to the respective semiconductor chip portions and configured to generate identification codes to select the semiconductor chip portions respectively, coincidence detection circuits provided on the semiconductor wafer to correspond to the respective semiconductor chip portions, and switching circuits provided in the respective semiconductor chip portions to control connection between inside and outside, the method comprising:
providing a chip select signal from part of the test pads to each of the coincidence detection circuits;
determining whether or not the chip select signal and the respective identification codes corresponding to the semiconductor chip portions coincide with each other, by the coincidence detection circuits, and closing one of the switching circuits corresponding to one of the semiconductor chip portions for which determination is made as coincident; and
executing a test of the one of the semiconductor chip portions for which determination is made as coincident, by providing a test signal to the one of the semiconductor chip portions from the test apparatus via part of the test pads,
wherein a plurality of semiconductor wafer devices having different numbers of semiconductor chip portions and the same number of test pads arranged in the same manner are tested using the same test apparatus.

20. A method for testing a semiconductor wafer device with a test apparatus, the semiconductor wafer device including a plurality of semiconductor chip portions provided on a semiconductor wafer, a pad portion having a plurality of test pads provided at a peripheral portion between the semiconductor chip portions and a peripheral edge of the semiconductor wafer, and a plurality of bus lines, one end of each of the bus lines being connected to the corresponding semiconductor chip portion, and the other end of each of the bus lines being connected to one of the test pads, the method comprising:
executing a test of the semiconductor chip portions by providing a test signal from the test apparatus to each of the semiconductor chip portions via each of part of the test pads and part of the bus lines; and
outputting test results from each of the semiconductor chip portions to the test apparatus via part of the bus lines and part of the test pads,
wherein a plurality of semiconductor wafer devices having different numbers of semiconductor chip portions and different numbers of bus lines, and having the same number of test pads arranged in the same manner are tested using the same test apparatus.

* * * * *